(12) United States Patent
Shahbazi et al.

(10) Patent No.: US 12,597,931 B2
(45) Date of Patent: Apr. 7, 2026

(54) CLOCK INSERTION DELAY SYSTEMS AND METHODS

(71) Applicant: Lattice Semiconductor Corporation, Hillsboro, OR (US)

(72) Inventors: Maryam Shahbazi, Walnut Creek, CA (US); Bradley A. Sharpe-Geisler, San Jose, CA (US); Senani Gunaratna, Los Gatos, CA (US); Loren L. McLaury, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 163 days.

(21) Appl. No.: 18/526,943

(22) Filed: Dec. 1, 2023

(65) Prior Publication Data

US 2024/0183902 A1 Jun. 6, 2024

Related U.S. Application Data

(60) Provisional application No. 63/430,056, filed on Dec. 4, 2022.

(51) Int. Cl.
*H03K 19/17764* (2020.01)
*G01R 31/317* (2006.01)
*G01R 31/3185* (2006.01)

(52) U.S. Cl.
CPC . *H03K 19/17764* (2013.01); *G01R 31/31725* (2013.01); *G01R 31/31727* (2013.01); *G01R 31/318594* (2013.01)

(58) Field of Classification Search
CPC ........ H03K 19/17764; G01R 31/31725; G01R 31/31727; G01R 31/318594

USPC ......................................................... 713/401
See application file for complete search history.

(56) References Cited

U.S. PATENT DOCUMENTS

| | | | |
|---|---|---|---|
| 6,353,352 B1 * | 3/2002 | Sharpe-Geisler | ......... G06F 1/10 |
| | | | 327/295 |
| 6,639,449 B1 | 10/2003 | Cruz et al. | |
| 6,885,227 B2 | 4/2005 | Agrawal et al. | |
| 7,019,577 B2 | 3/2006 | Agrawal et al. | |
| 7,091,763 B1 | 8/2006 | Johnson et al. | |

(Continued)

FOREIGN PATENT DOCUMENTS

| | | |
|---|---|---|
| CN | 101267292 B | 4/2011 |
| CN | 101657966 B | 5/2012 |

(Continued)

*Primary Examiner* — Brian T Misiura
(74) *Attorney, Agent, or Firm* — Haynes and Boone, LLP

(57) ABSTRACT

Various techniques are provided to efficiently synchronize clock and data signals in programmable logic devices (PLDs). In one example, a method comprises configuring an intellectual property (IP) block of the PLD to receive a first clock signal and a first data signal at a first component of the IP block, determining a delay associated with the first clock signal between a first input and the first component, configuring a programmable logic cell (PLC) to receive a second clock signal and output the first data signal to the IP block, determining a delay period to synchronize the first clock signal and the first data signal at the first component of the IP block, and configuring an adjustable delay element to apply the delay period to the second clock signal to synchronize the first clock signal and the first data signal at the first component of the IP block.

20 Claims, 9 Drawing Sheets

(56) References Cited

U.S. PATENT DOCUMENTS

| | | | |
|---|---|---|---|
| 7,456,672 | B1 | 11/2008 | Callahan et al. |
| 7,509,598 | B1 | 3/2009 | Shen et al. |
| 7,557,606 | B1 | 7/2009 | Chen et al. |
| 7,956,695 | B1 | 6/2011 | Ding et al. |
| 8,130,019 | B1 | 3/2012 | Awad et al. |
| 8,255,733 | B1 | 8/2012 | Bartel et al. |
| 9,390,220 | B2 | 7/2016 | Yi et al. |
| 9,672,307 | B2 | 6/2017 | Chen et al. |
| 10,148,472 | B2 | 12/2018 | Sharpe-Geisler |
| 10,326,627 | B2 | 6/2019 | Sharpe-Geisler |
| 2003/0212930 | A1 | 11/2003 | Aung et al. |
| 2006/0095605 | A1 | 5/2006 | Lee et al. |
| 2007/0054643 | A1 | 3/2007 | Kraegeloh et al. |
| 2008/0065936 | A1 | 3/2008 | Pietri et al. |
| 2008/0225933 | A1 | 9/2008 | Chan et al. |
| 2012/0182473 | A1 | 7/2012 | Kim et al. |
| 2015/0178436 | A1 | 6/2015 | Chen et al. |
| 2016/0026745 | A1 | 1/2016 | Yi et al. |

FOREIGN PATENT DOCUMENTS

| | | | |
|---|---|---|---|
| CN | 102820885 | A | 10/2015 |
| CN | 103490775 | A | 2/2016 |
| CN | 109891843 | A | 3/2022 |
| EP | 1459531 | B1 | 2/2018 |
| EP | 3510738 | B1 | 8/2021 |
| KR | 2001-0112319 | A | 12/2001 |

* cited by examiner w/added PLC Data Delay Element

W/O added CLK skew w/o Data Delay Element

600

FINALIZE IP BLOCK DESIGN AND ROUTING — 610

CALCULATE IP CLOCK DELAY — 620

CALCULATE DELAY ASSOCIATED WTH PLC DATA SIGNAL — 630

DETERMINE DELAY PERIOD TO SYNCHRONIZE IP CLOCK AND PLC DATA SIGNAL AT IP COMPONENT — 640

APPLY DELAY PERIOD TO SKEW PLC CLOCK AND/OR CONFIGURE AN ADJUSTABLE DELAY ELEMENT — 650

CLOCK INSERTION DELAY SYSTEMS AND METHODS

CROSS-REFERENCE TO RELATED APPLICATION

This application claims priority to and the benefit of U.S. Provisional Patent Application 63/430,056 filed Dec. 4, 2022, and entitled "Clock Insertion Delay Systems And Methods," which is hereby incorporated by reference in its entirety.

TECHNICAL FIELD

The present disclosure relates to programmable logic devices (PLDs), such as field-programmable gate arrays (FPGAs), and, in particular for example, to systems and methods for controlling clock signals to prevent hold-time violations in a programmable logic device that includes circuit blocks having a plurality of types with clock insertion delays that differ.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

The timing of clock and data signals in a PLD is affected by the area of the PLD, processing operations, and the complexity of various PLD components which can lead to mismatches such as delays or timing mismatch between PLD components. Various approaches to eliminate mismatches between clock channels and data channels include layout techniques, providing gate delays, and trimming. However, these approaches often add delay elements to slow processing which further increases the costs and PLD area. In view of the foregoing, there is a need for improved clock techniques for PLDs, which may reduce and/or control mismatch and provide improved skew control.

SUMMARY

Various techniques are provided to efficiently synchronize clock and data signals in programmable logic devices (PLDs). In one example, a synchronization process includes configuring an intellectual property (IP) block of the PLD to receive a first clock signal and a first data signal at a first component of the IP block, determining a delay associated with the first clock signal between a first input and the first component, configuring a programmable logic cell (PLC) to receive a second clock signal and output the first data signal to the IP block, determining a delay period to synchronize the first clock signal and the first data signal at the first component of the IP block, and configuring an adjustable delay element the PLC to apply the delay period to the second clock signal to synchronize the first clock signal and the first data signal at the first component of the IP block.

In another example, a programmable logic device (PLD) includes an intellectual property (IP) block configured to receive a first clock signal and a first data signal at a first component, a programmable logic cell (PLC) configured to receive a second clock signal and output the first data signal to the IP block, and an adjustable delay element configured to apply a delay period to the second clock signal to synchronize the first clock signal and the first data signal at the first component of the IP block.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

The present disclosure is directed to techniques for improving synchronization between clock signals and data signals in a manner that avoids introducing delay elements in the various components of the PLD. In various implementations, clock signals provided to low complexity components of a PLD may be intentionally delayed in a manner that compensates for delays associated high complexity components.

For example, a low complexity component of PLD (e.g., a programmable logic cell (PLC) and/or others) may exhibit a relatively short delay between the time a clock signal is received and when a data signal is ready to be written thereto or provided to another component. In contrast, a high complexity component (e.g., an intellectual property (IP) hardware block such as embedded block ram (EBR) block, digital signal processing (DSP) block, programmable input/output (PIO) block, and/or others) may exhibit a relatively long delay between the time a clock signal is received and when a data signal ready to be written thereto or provided to another component.

Conventionally, this disparity in delays may require a hardware delay element to be added to a data input path of the high complexity component. This delay element may delay the data signal received from the low complexity component through the data input path until after a clock signal has propagated through the high complexity component and after its associated hold time has passed. By delaying the data signal in the high complexity component in this manner, the data signal can be reliably written into the high complexity component despite the inherent clock signal propagation delay associated with the high complexity component.

Such conventional approaches require hardware delay elements to be physically implemented in numerous components distributed throughout the PLD. This can result in substantial costs in power consumption, physical area used, and additional complexity. Thus, by intentionally delaying clock signals provided to low complexity components of a PLD as set forth in the present disclosure, clock signals and data signals can be reliably synchronized (e.g., to satisfy various setup time and hold time requirements) without requiring the additional hardware delay elements associated with conventional approaches.

Figure 1:
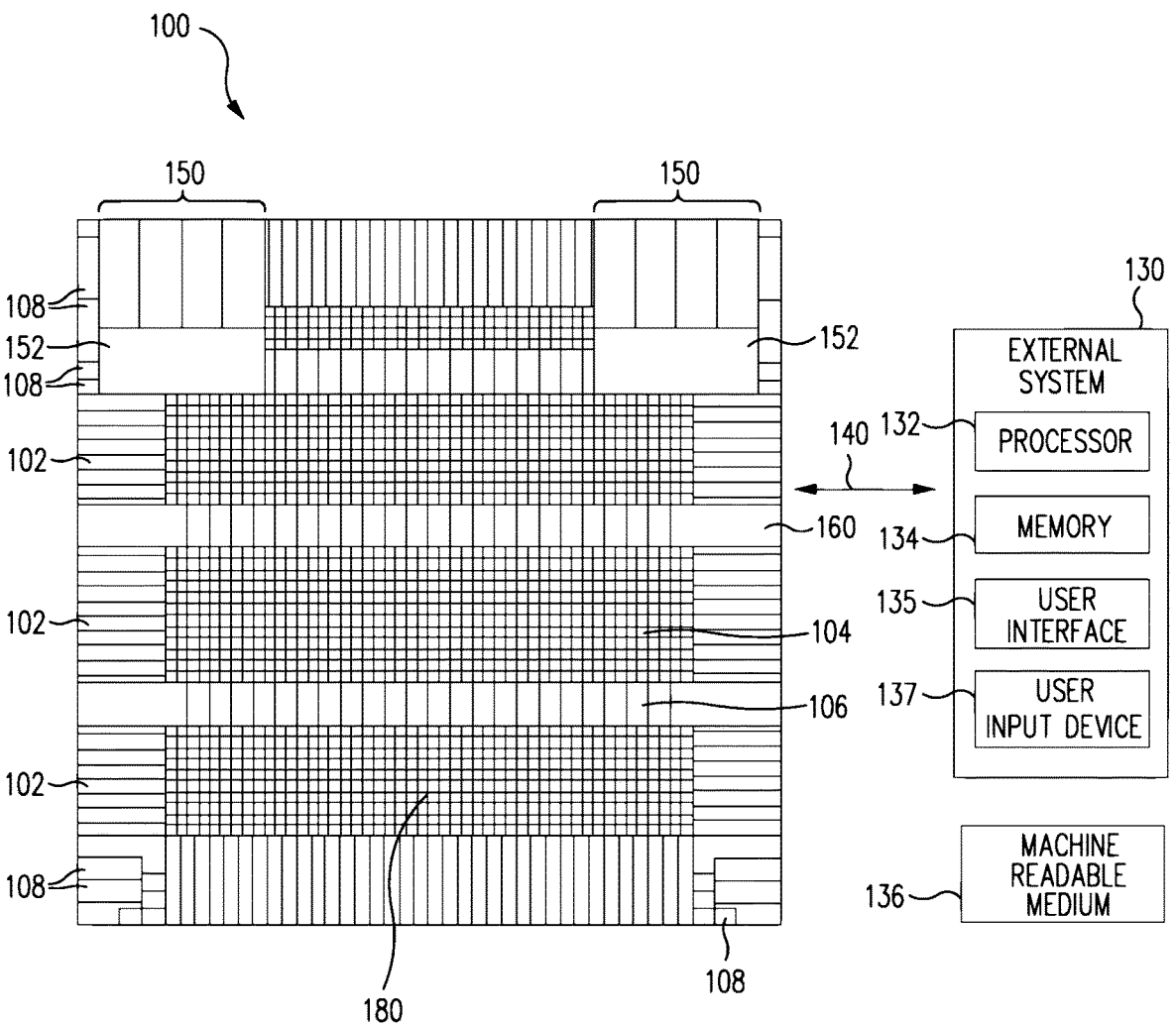
FIG. 1 illustrates a block diagram of a programmable logic device (PLD) in accordance with an implementation of the disclosure.

Referring now to the drawings, FIG. 1 illustrates a block diagram of a PLD 100 in accordance with an implementation of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various implementations, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various implementations disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, various routing resources, and any other appropriate components of PLD 100 may be configured to operate in accordance with user-specified applications.

In the illustrated implementation, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine-readable mediums 136 (e.g., which may be internal or external to system 130). For example, in some implementations, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
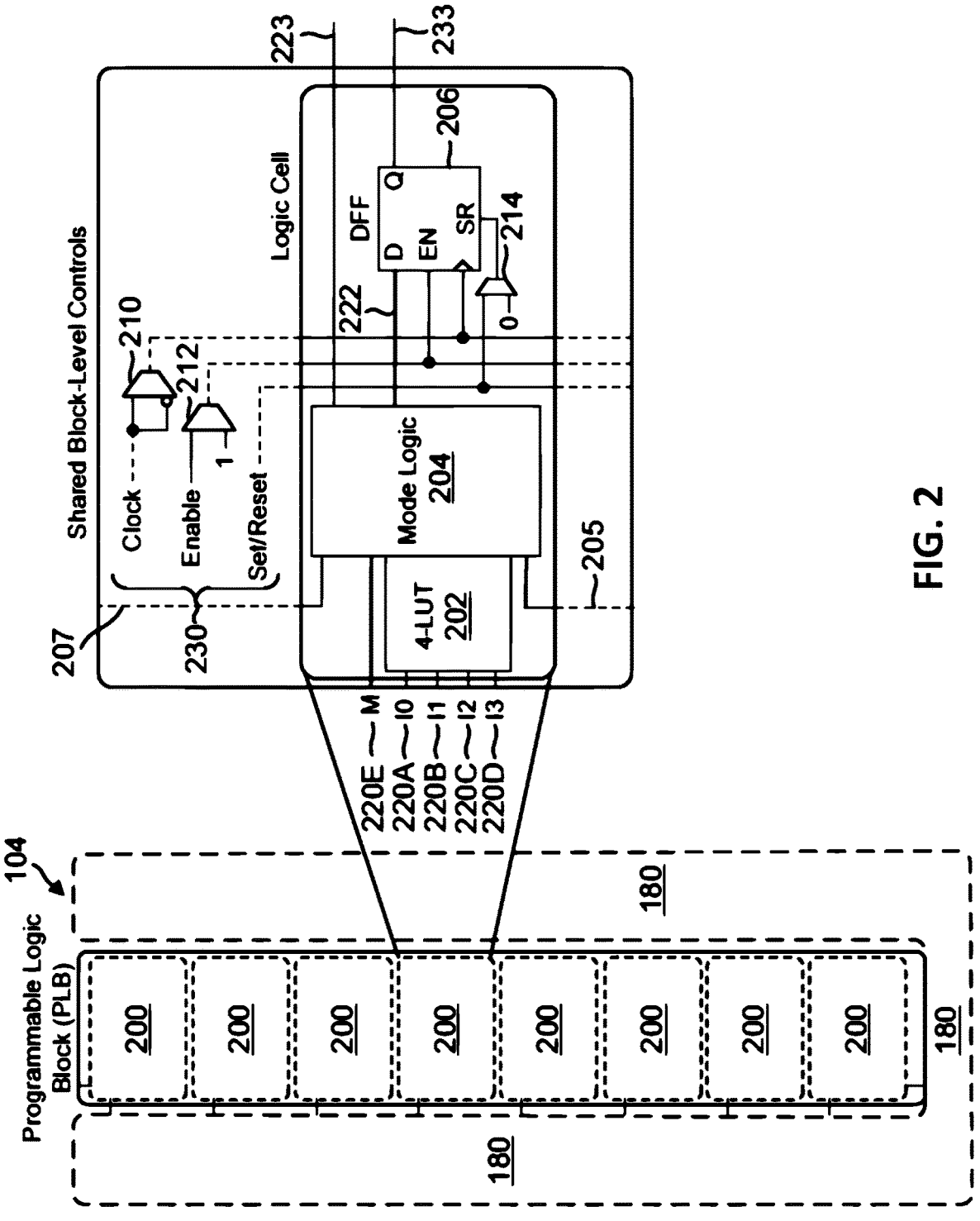
FIG. 2 illustrates a block diagram of a logic block for a PLD in accordance with an implementation of the disclosure.

FIG. 2 illustrates a block diagram of a logic block 104 of PLD 100 in accordance with an implementation of the disclosure. As discussed, PLD 100 includes a plurality of logic blocks 104 including various components to provide logic and arithmetic functionality.

In the example implementation shown in FIG. 2, logic block 104 includes a plurality of logic cells 200, which may be interconnected internally within logic block 104 and/or externally using routing resources 180. For example, each logic cell 200 may include various components such as: a lookup table (LUT) 202, a mode logic circuit 204, a register 206 (e.g., a flip-flop or latch), and various programmable multiplexers (e.g., programmable multiplexers 210, 212 and 214 used for control signals in the figure). Other multiplexers may be in the mode logic for dynamically selecting between one 4-LUT output and the output of a different 4-LUT as controlled by the signal M. Hence, selecting desired signal paths for logic cell 200 and/or between logic cells 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. Mode Logic 204 may include various logic elements and/or additional inputs, such as input 220E, to support the functionality of the various modes, as described herein. LUT 202 in other examples may be of any other suitable size having any other suitable number of inputs for a particular implementation of a PLD. In some implementations, different size LUTs may be provided for different logic blocks 104 and/or different logic cells 200.

An output signal 222 from LUT 202 and/or mode logic 204 may in some implementations be passed through register 206 to provide an output signal 233 of logic cell 200. In various implementations, an output signal 223 from LUT 202 and/or mode logic 204 may be passed to output 223 directly, as shown. Depending on the configuration of multiplexers 210-214 and/or mode logic 204, output signal 222 may be temporarily stored (e.g., latched) in latch (or FF) 206 according to control signals 230. In some implementations, configuration data for PLD 100 may configure output 223 and/or 233 of logic cell 200 to be provided as one or more inputs of another logic cell 200 (e.g., in another logic block or the same logic block) in a staged or cascaded arrangement (e.g., comprising multiple levels) to configure logic operations that cannot be implemented in a single logic cell 200 (e.g., logic operations that have too many inputs to be implemented by a single LUT 202). Moreover, logic cells 200 may be implemented with multiple outputs and/or interconnections to facilitate selectable modes of operation.

Mode logic circuit 204 may be utilized for some configurations of PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, mode logic circuits 204, across multiple logic cells 202, may be chained together to pass carry-in signals 205 and carry-out signals 207, and/or other signals (e.g., output signals 222) between adjacent logic cells 202, as described herein. In the example of FIG. 2, carry-in signal 205 may be passed directly to mode logic circuit 204, for example, or may be passed to mode logic circuit 204 by configuring one or more programmable multiplexers, as described herein. In some implementations, mode logic circuits 204 may be chained across multiple logic blocks 104.

Logic cell 200 illustrated in FIG. 2 is merely an example, and logic cells 200 according to different implementations may include different combinations and arrangements of PLD components. Also, although FIG. 2 illustrates logic block 104 having eight logic cells 200, logic block 104 according to other implementations may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

Portions of a user design may be adjusted to occupy fewer logic cells 200, fewer logic blocks 104, and/or with less burden on routing resources 180 when PLD 100 is configured to implement the user design. Such adjustments according to various implementations may identify certain logic, arithmetic, and/or extended logic operations, to be implemented in an arrangement occupying multiple implementations of logic cells 200 and/or logic blocks 104. An optimization process may route various signal connections associated with the arithmetic/logic operations such that a logic, ripple arithmetic, or extended logic operation may be implemented into one or more logic cells 200 and/or logic blocks 104 to be associated with the preceding arithmetic/logic operations. The synchronization of clock signals, data, and other signals in a PLD is an important aspect of system design and performance. Many data signals will arrive at a circuit component at different times based on processing delays, signal path length, and other design aspects and system constraints. These variations can limit the performance of the design.

As previous discussed with respect to FIGS. 1-2, a PLD is designed to perform a desired function using various interconnected elements that may include blocks of memory (e.g., embedded block memory (EBR)), a clock distribution network (e.g., a clock tree), special function blocks (e.g., digital signal processing (DSP) blocks), routing resources, logic blocks (e.g., programmable logic cells (PLCs), and other elements. The various elements/blocks have different clock and data signal delays that are commonly addressed by inserting hold time fixing delays in the data input paths.

Figure 3:
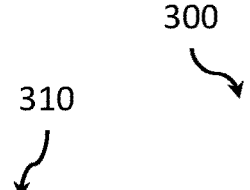
FIG. 3 illustrates clock delay for elements of an example PLD in accordance with an implementation of the disclosure.
Figure 3:
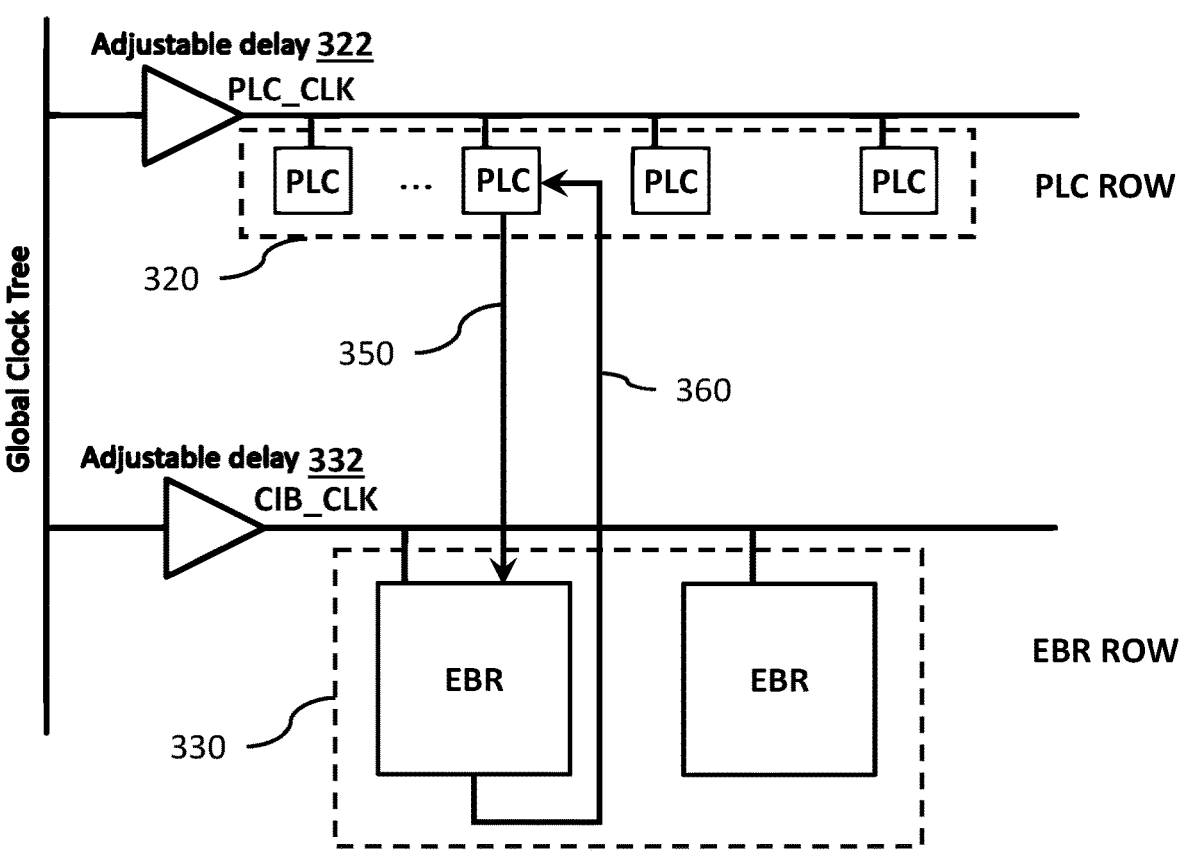

FIG. 3 illustrates clock delay for elements of an example PLD. The illustrated PLD elements 300 include a global clock tree 310, PLC blocks 320, and EBR blocks 330. It will be appreciated that the elements of FIG. 3 are presented at a high level for purposes of illustrating the clock delay solutions described herein and that a PLD will include additional and/or few elements than illustrated. The global clock tree 300 distributes synchronized clock signals to various elements/blocks of the PLD, including the PLC blocks 320 and EBR blocks 330. Adjustable delay elements 322 and 332 may be used to synchronize the clock signal PLC_CLK at the input to the PLC row, and the clock signal, CIB_CLK at the input to the EBR row.

In operation, the EBR blocks 330 are usually larger (e.g., more complex) than the PLC blocks 320, resulting in a larger clock delay in the EBR blocks 330. As a result, hold time violations of a registered signal in a PLC block 320 to an input register of a EBR block 330 (e.g., data signal path 350) may occur. One conventional approach is to add delay elements on all of the data and address inputs to the EBR, which will generally slow performance of the PLD and add numerous components and area to the PLD design increasing costs. The delay in the EBR block 330 may create additional delay in other elements that may further slow performance. For example, in implementations where an output of the EBR block 330 is provided as an input of the PLC block 320 (e.g., data signal path 360), the longer clock delay in the EBR block pushes out Tco which becomes added setup delay to the PLC.

Figure 4:
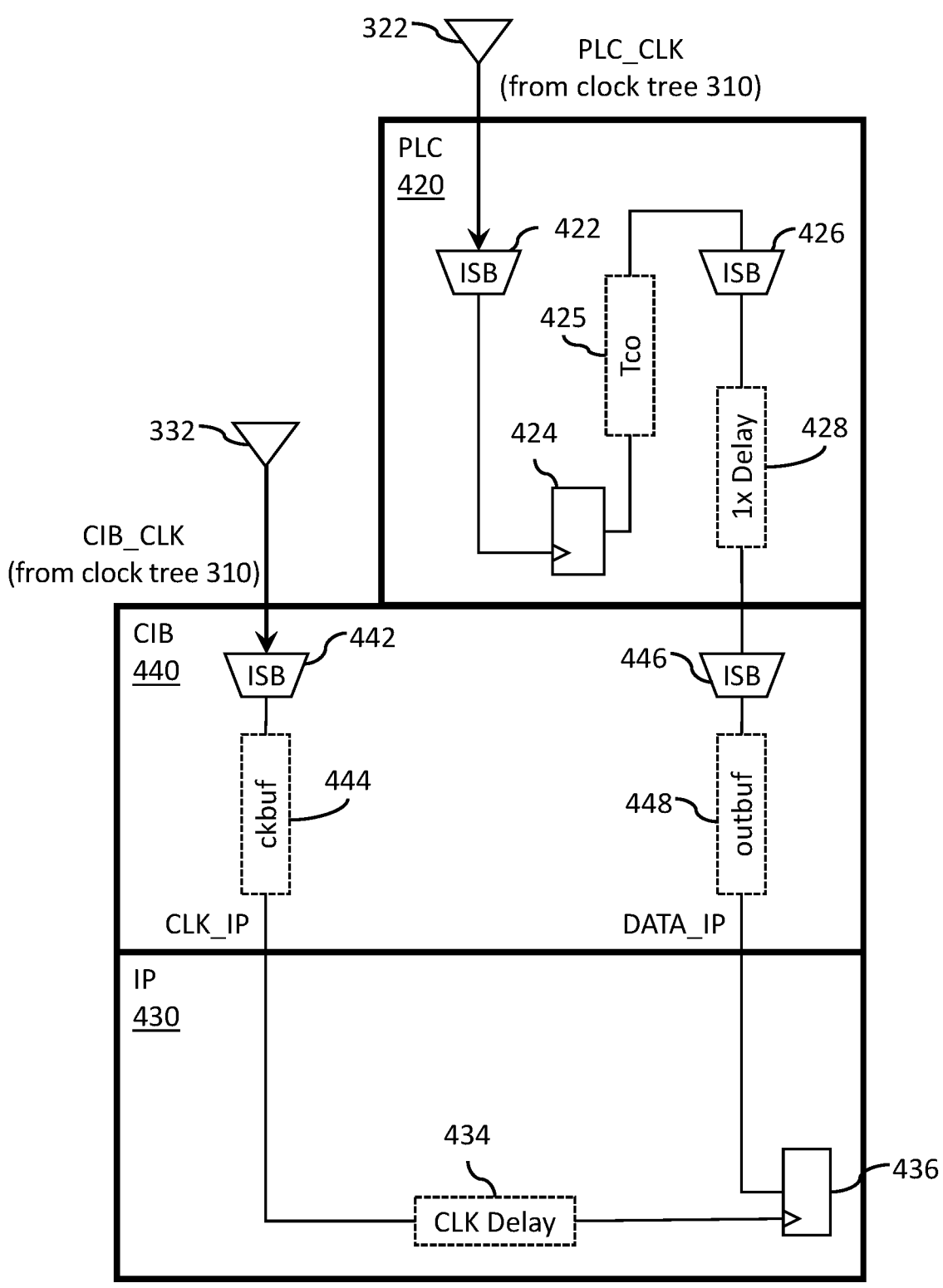
FIG. 4 illustrates an example implementation for addressing clock delay between a PLC and an IP block in accordance with an implementation of the disclosure.

Referring to FIG. 4, an example implementation for addressing clock delay is illustrated. In this approach, delay is added at or before the PLC level to equalize the relative timing between the flip-flops in the PLC blocks 320 and the EBR block 330 flip-flops of FIG. 3.

As illustrated, a configurable interconnect block (CIB) block 440 provides an interface between the PLC block 420 and an IP block 430. The IP block 430 may be implemented as an EBR block, a DSP block, a programmable input/output cell (PIC), or other IP block. In various implementations the CIB block 440 includes a routing block and may be configured to buffer signals and generate control signals for other blocks. In the illustrated implementation, the CIB 440 receives a clock signal, CIB_CLK, from a clock source (e.g., the clock tree 310) which is routed through an ISB 442 and into a clock buffer 444 for input (CLK_IP) to the IP block 430. The CIB 440 also provides a data path from the PLC 420 to the IP block, routing the PLC output through ISB 446 and into output buffer 448 for input (DATA_IP) to the IP block 430.

The PLC 420 receives a clock signal, PLC_CLK, from a source clock, such as from clock tree 310. The clock signal PLC_CLK may be delayed/skewed, for example, by adjustable delay element 322. The PLC block 420 data path further includes an input switch block (ISB) 422, a buffer 425, which has an associated clock to output delay (represented by Tco 425), and an ISB 426. Additional inherent delay in the PLC 420 data path is represented by 1× Delay 428. In various implementations, the adjustable delay element 322 compensates for the delay in the IP block 420, such that the PLC output, DATA_IP, arrives at the IP block 430 buffer 436 (e.g., a register, flip-flop, etc.) in synchronization with the clock signal, CLK_IP. In some implementations, the delay period applied by adjustable delay element 322 is determined by comparing the difference between the clock signal delay through clock buffer 444 (clkbuf) and the IP block 430 (represented by CLK delay 434) and the delay in the PLC data signal path, including Tco 425, other PLC 420 delay (represented by 1× delay 428), and output buffer 448 (outbuf) between the PLC 420 output and the input buffer 436 of the IP block 430.

The implementation of FIG. 4 provides numerous advantages over conventional approaches. In one conventional approach, an artificial delay is added to all data lines of the IP block which can significantly increase the number of components in the PLD design, increasing the needed design area and costs. In contrast and as illustrated in FIG. 3, a single adjustable delay element 322 may be used (e.g., at the clock tree level) to synchronize a plurality of PLCs 320 and EBRs 330. Further, by removing the delay element from the IP block 430, the IP block 430 is no longer slowed by the internal delay. This not only results in a faster IP block 430, but may also improve the overall cycle time. For example, in this design the data path from the PLC 420 to the IP block 430 is shorter (e.g., no delay element) and, because of the added clock delay, the PLC 420 has a shorter waiting time for data received from the IP block 430 (e.g., as illustrated by the data signal path 360 in FIG. 3).

Figure 5A:
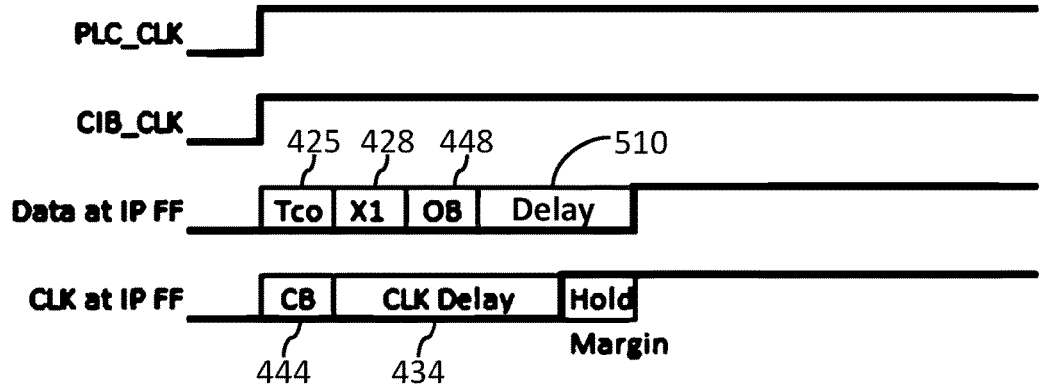
FIGS. 5A and 5B illustrate timing diagrams showing examples of an implementation using an added data delay element an implementation using clock skew without the added data delay element in accordance with an implementation of the disclosure.
Figure 5B:
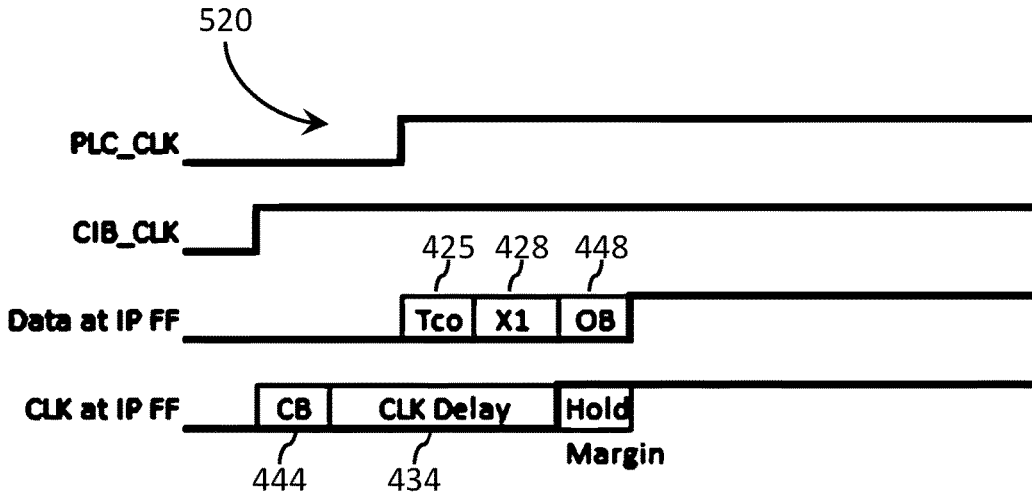

FIGS. 5A and 5B illustrate timing diagrams showing examples of different implementations described in the present disclosure. FIG. 5A illustrates a timing diagram for an implementation with an added delay element to the data signal path. As illustrated, after the clock signals are received, there is a delay until the data from the PLC block and CLK signal from the CIB block are received at an IP block flip-flop. The data, which is received from the PLC block, is delayed by a clock to output delay (Tco 425), an output buffer delay (OB 448) and additional data path delay X1 428. An added delay 510 (e.g., from a delay component on a data line of the IP block)) delays the output of the data until after the clock signal (which was delayed by CIB Buffer (CB) 444 and CLK Delay 434) is received at the flip-flop of the IP block. In conventional systems, a delay component is added to the data path of the IP block to hold the data until the clock signal is received. In some implementations, the data output from the IP block may be received by the PLC block for processing in the next clock cycle.

FIG. 5B illustrates a timing diagram for an implementation that skews the PLC clock (e.g., through adjustable delay 322 of FIGS. 3 and 4). In this implementation, an added delay element is not needed in either the data signal path of the IP block or the data signal path of the PLC block. As illustrated, the PLC_clock is skewed by a delay period 520 to synchronize the data with the clock signal at the flip-flop of the IP block. After the CIB clock signal is received, there is a delay in the PLC_CLK signal to account for the delays associated with the clock buffer delay, CLK Delay and Hold Margin delay of the IP block. In some implementations, the data output from the IP block may be received by the PLC block for processing in the next clock cycle. In some implementations, the added delay may be achieved by combining a clock skew delay and delay elements in or at the IP block.

Figure 6:
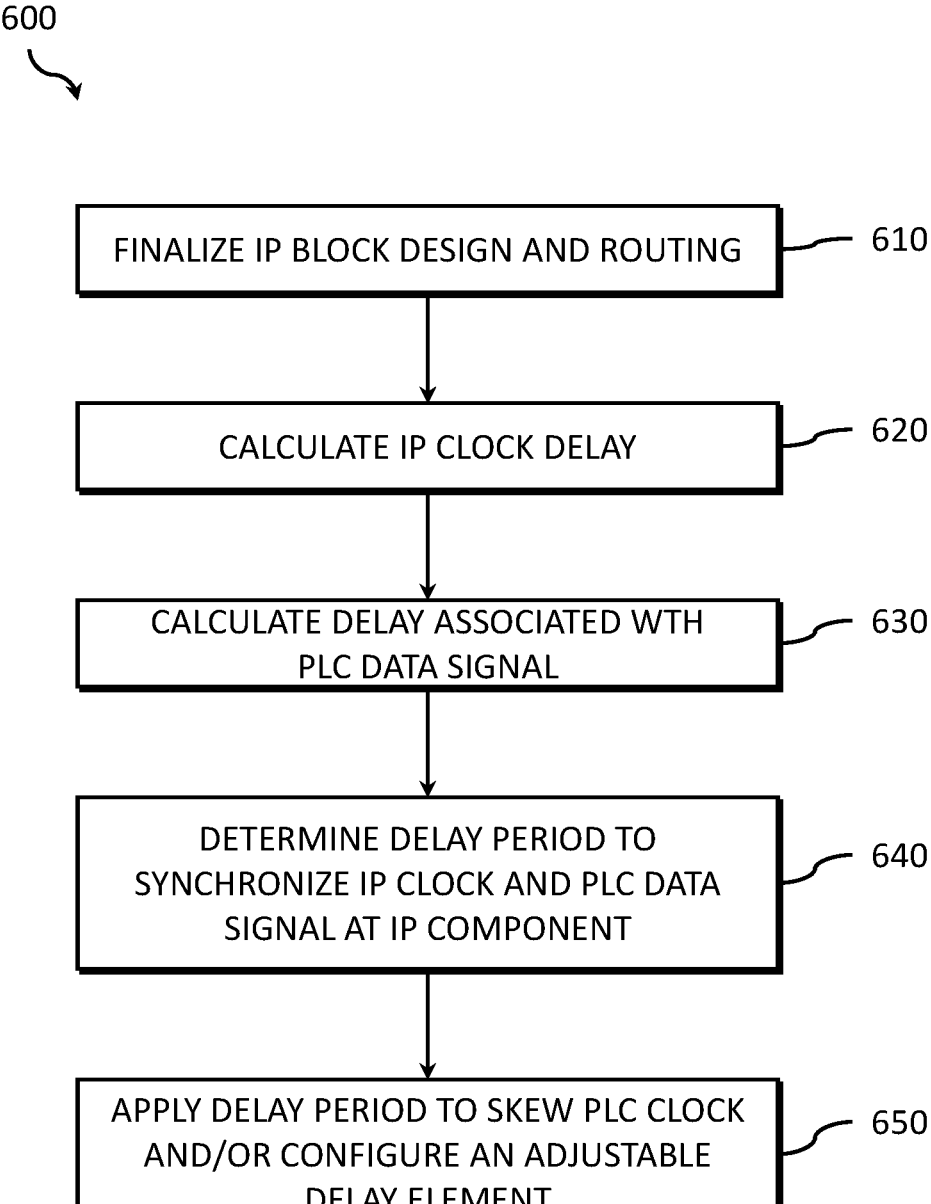
FIG. 6 illustrates an example process for implementing a clock delay solution of the present disclosure.

FIG. 6 illustrates an example process 600 for implementing a clock delay solution of the present disclosure. In operation 610, the design and layout of the IP block (e.g., EBR, DSP, PIC, etc.) and associated routing is finalized. In operation 620, the clock delay to a component (e.g., register, flip-flop, etc.) of the IP block is calculated from the final IP block design. In operation 630, the delay from the clock signal input at the PLC block to receipt of the PLC data signal at the component (e.g., same component as used in operation 620) of the IP block is calculated. Next, in operation 640, a delay period to synchronize the IP clock signal and the PLC data signal at the IP component is determined. In one implementation, the delay period is a difference between the calculated IP clock delay (from operation 620) and PLC data signal delay (from operation 630). In operation 650, the delay period is applied to skew the PLC clock and/or configure an adjustable delay element at or before the PLC block. In one implementation, the PLC clock is skewed by the data period. In some implementations, the delay period is applied by a combination of PLC clock skew and adding a delay element to the PLC data signal path. In some implementations, the PLD includes a plurality PLCs and IP blocks, and the adjustable delay element skews the PLC clock and/or configures an adjustable delay element for input to multiple PLDs.

Figure 7:
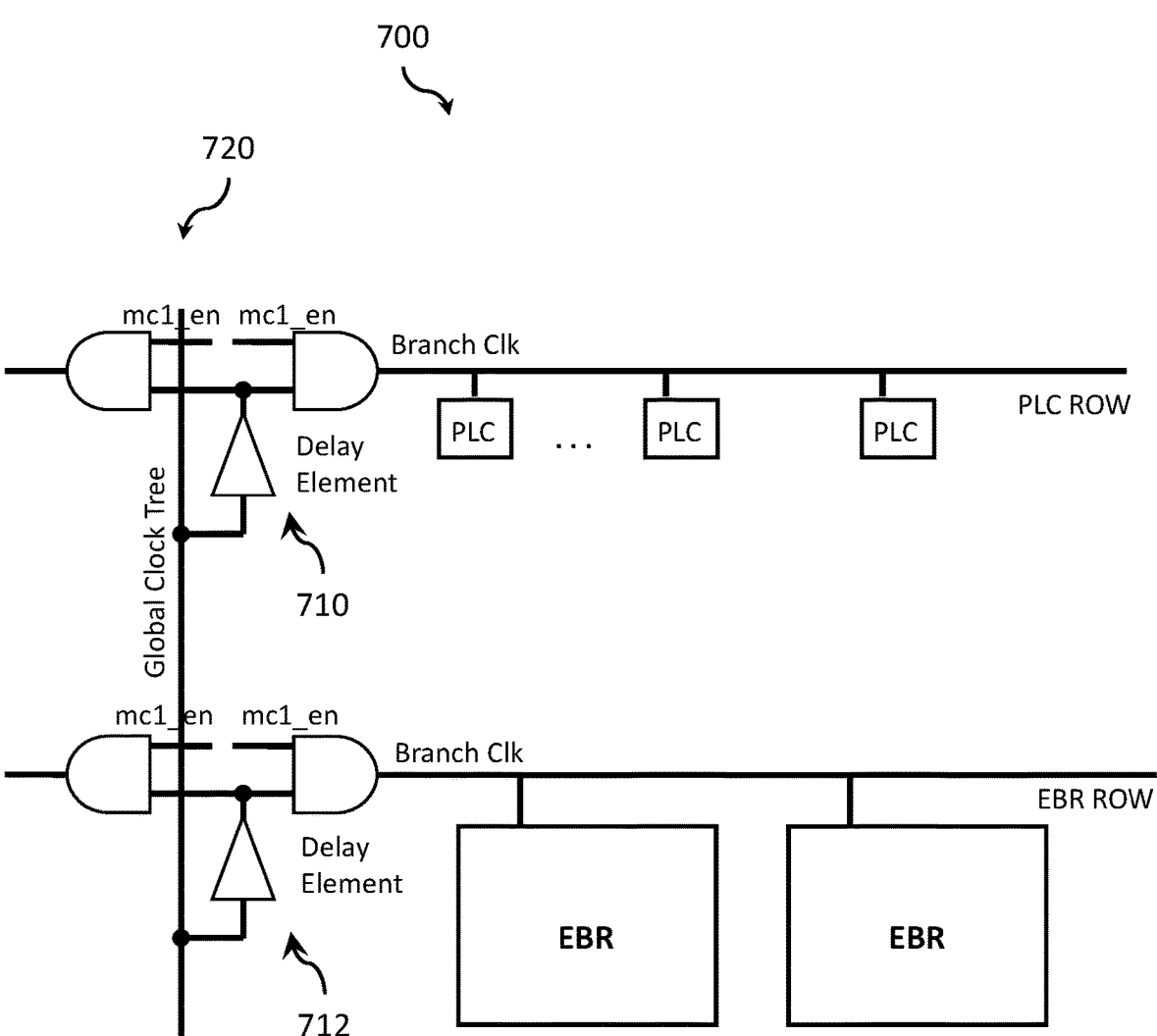
FIG. 7 illustrates an example clock solution in accordance with an implementation of the present disclosure.
Figure 8:
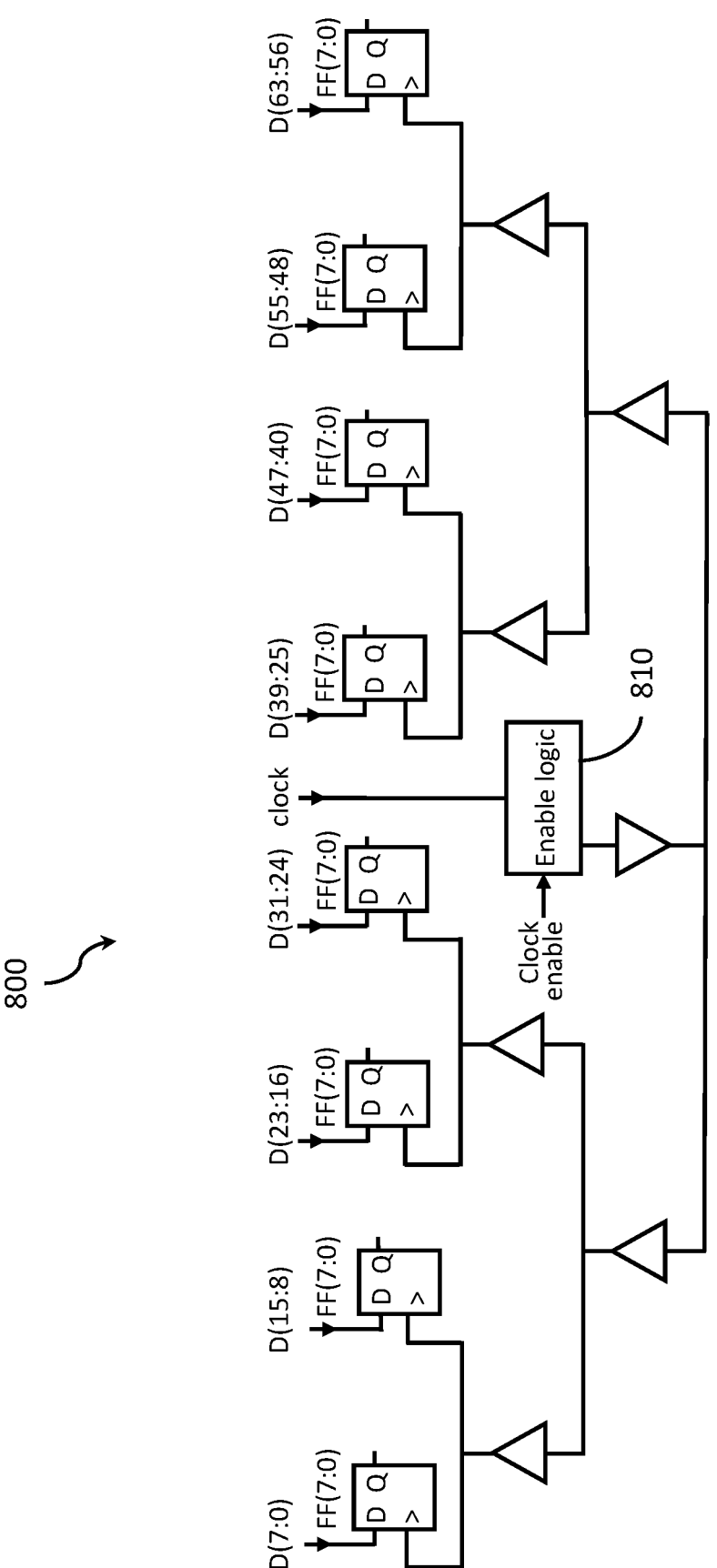
FIG. 8 illustrates an example IP block in accordance with an implementation of the present disclosure.
Figure 9:
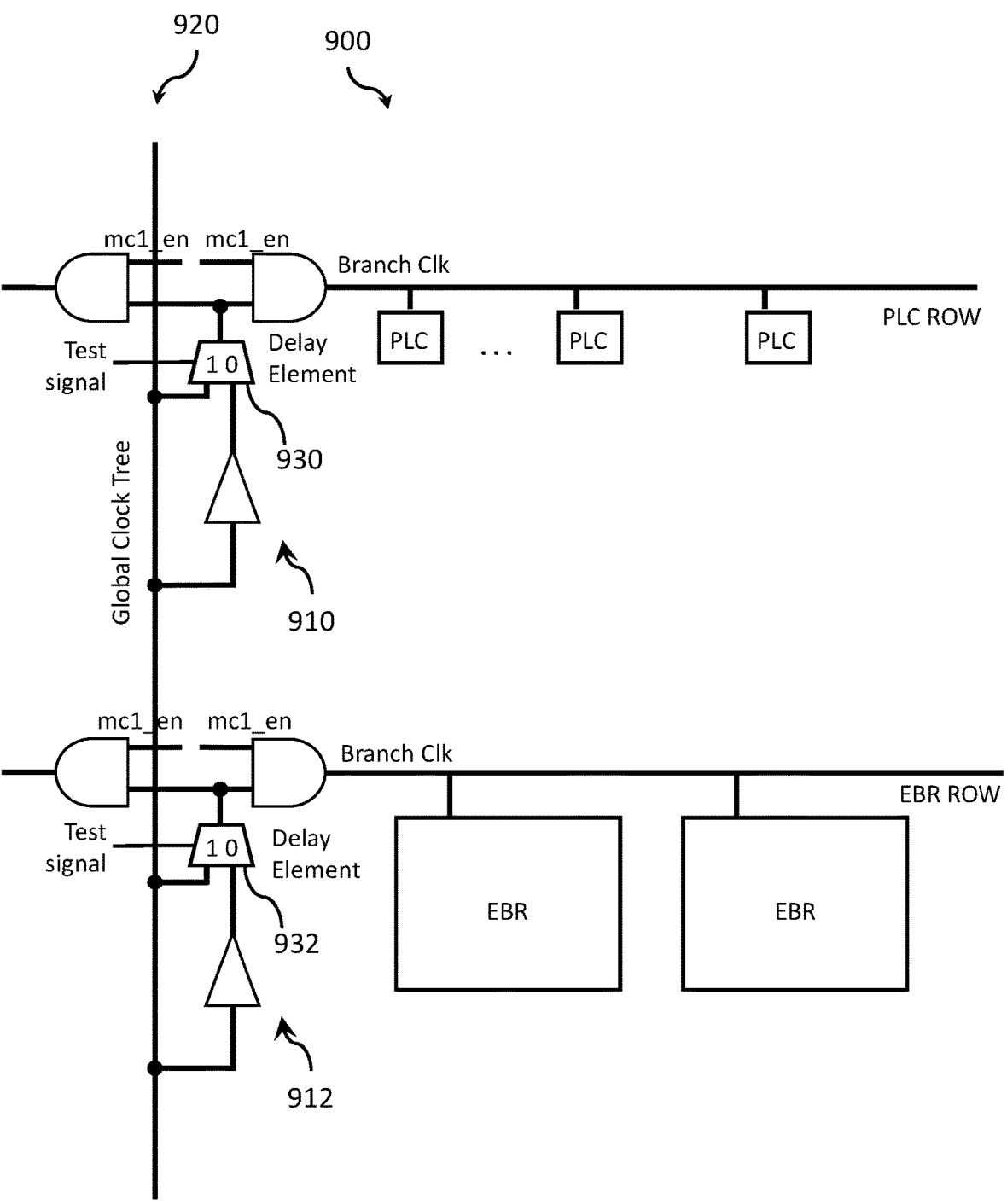
FIG. 9 illustrates an example clock solution, including a test mode, in accordance with an implementation of the present disclosure.

FIGS. 7-9 illustrate various example design and testing considerations of the present disclosure. When designing a PLD (e.g., PLDs previously described herein with reference to FIG. 1-6), it is generally desirable to design the clock tree to be uniform and as fast as possible. For example, a fast clock is desirable as it tends to have less jitter and skew. Further, the EBR (DSP) is bigger than the PLC and has an internal clock delay that is greater than the PLC. This results in potential hold-time violations of a registered signal from a nearby PLC to the input register of an EBR. The standard solution is to add sufficient delays internally on all the data and address inputs of the EBR (DSP) so that relative to its boundary, it meets zero hold time. Then, if the clock arrives simultaneously to the boundaries of all IP blocks, the system can meet zero hold time across the chip.

Referring to FIG. 7, the IP blocks using the systems and methods of the present disclosure don't need to meet zero hold time. In the illustrated system 700, the clock delay 710 is added in the clock tree 720 and may be configured to only affect the blocks that do not have a hold-time issue. The EBR (DSP) is bigger than the PLC and the internal clock delay in the EBR (DSP) is greater than the internal clock delay in the PLC. This results in potential hold-time violations of a registered signal from a nearby PLC to the input register of the EBR. In various implementations of the present disclosure, an approach is to add a delay element 710 to the clock branch for the PLC row to equalize the relative timing between FF's in the PLCs and the FFs in the EBRs. This addresses EBR hold time at the chip level (rather than at the IP level). As illustrated, for example, the clock tree 720 may have one or more optionable delay element 710 (e.g., a metal delay element), which can be used to compensate for clock delay in the EBR. The clock delay may further include an optional delay element 712 to the EBR row (e.g., metal optional delay), which can be used for minimum delay.

Referring FIG. 8, an example of an IP block 800 with a large clock delay is illustrated. In a conventional system, the IP block adds an input delay for data (EBR write data capture) in order to meet zero hold-time requirement. As illustrated, the example IP block 800 is characterized by a large clock delay but small input delay for data (EBR write data capture) resulting in a positive hold time at the boundary of the IP. In various implementations, the single clock input has enable logic 810 in series with it and a 64 register fanout that uses an internal clock tree, all of which has the effect of delaying the clock. For the data path D(63:0) there is almost no delay. This arrangement is representative of the input part of a EBR (Embedded Block Ram). Note that the same clock would also need to fanout to 15 address registers. For EBR read there is a longer Tco (clock to out) for the same reason.

Referring to FIG. 9, an example implementation of a system 900 (such as PLDs described herein with respect to FIGS. 1-8) including a test mode will now be described. As previously discussed, the EBR (DSP) is bigger than the PLC and the internal clock delay in the EBR (DSP) is greater than the PLC. This results in potential hold-time violations of a registered signal from a nearby PLC to the input register of the EBR. In this implementation a delay element 910 is added (in clock tree 920) to the PLC clock rows to equalize relative timing between FF's in the PLC and the EBR (DSP) FF's. A test signal is used to bypass the delay through switch 930 (e.g., a mux) for testing using the scan chain. This may be implemented as a Design For Test (DFT) feature. In some implementations, a delay element 912 may be added to the EBR rows, along with a switch 932 for implementing a test mode for the EBR row to bypass the delay 912.

Where applicable, various implementations provided by the present disclosure can be implemented using hardware, software, or combinations of hardware and software. Also, where applicable, the various hardware components and/or software components set forth herein can be combined into composite components comprising software, hardware, and/ or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

In this regard, various implementations described herein may be implemented with various types of hardware and/or software and allow for significant improvements in, for example, performance and space utilization.

Software in accordance with the present disclosure, such as program code and/or data, can be stored on one or more non-transitory machine-readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The implementations described above illustrate but do not limit the invention. It should also be understood that numerous modifications and variations are possible in accordance with the principles of the present invention. Accordingly, the scope of the invention is defined only by the following claims.

What is claimed is:

1. A method for synchronizing data signals and clock signals in a programmable logic device (PLD), the method comprising:
   configuring an intellectual property (IP) block of the PLD to receive a first clock signal and a first data signal at a first component of the IP block;
   determining a delay associated with the first clock signal between a first input and the first component;
   configuring a plurality of programmable logic cells (PLCs) to receive a second clock signal;
   configuring a particular one of the PLCs to output the first data signal to the IP block;
   determining a delay period to synchronize the first clock signal and the first data signal at the first component of the IP block, wherein the delay period is determined based on the delay associated with the first clock signal between the first input and the first component; and
   configuring an adjustable delay element to apply the delay period to the second clock signal to synchronize the first clock signal and the first data signal at the first component of the IP block by adjusting the second clock signal to delay output of the first data signal by the delay period.

2. The method of claim 1, wherein the IP block comprises a programmable input-output cell (PIC), an embedded distributed memory (EBR), or a digital signal processing (DSP) block.

3. The method of claim 1, further comprising configuring a configurable interconnect block (CIB) block to interface between the plurality of PLCs and a plurality of IP blocks.

4. The method of claim 3, wherein the delay period adjusted second clock signal is input to each of the plurality of PLCs to synchronize the PLCs with the plurality of IP blocks.

5. The method of claim 3, wherein the CIB comprises scan test logic configured to, when activated in a test mode, bypass the delay period of the second clock signal.

6. The method of claim 1, further comprising:
   configuring a clock tree to generate a plurality of clock signals, including the first clock signal and the second clock signal; and
   wherein the clock tree comprises the adjustable delay element.

7. The method of claim 1, further comprising
   adding a delay element to a data signal path of the first data signal to delay output of the first data signal by the delay period.

8. The method of claim 1, wherein:
   the IP block comprises a first data path configured to route the first data signal to the first component; and
   the first data path does not include a delay element.

9. The method of claim 1, further comprising configuring a configurable interconnect block (CIB) block to route the first data signal from the particular one of the PLCs to the IP block and route a second data signal, output from the IP block, to the particular one of the PLCs.

10. A programmable logic device (PLD) comprising:
an intellectual property (IP) block configured to receive a first clock signal and a first data signal at a first component;
a plurality of programmable logic cells (PLCs) configured to receive a second clock signal, wherein a particular one of the PLCs is configured to output the first data signal to the IP block; and
an adjustable delay element configured to apply a delay period to the second clock signal to synchronize the first clock signal and the first data signal at the first component of the IP block by adjusting the second clock signal to delay output of the first data signal by the delay period.

11. The PLD of claim 10, wherein the delay period corresponds to a difference between a delay associated with the first clock signal between a first input and the first component and a PLC delay between the second clock signal and receipt of the first data signal at the first component.

12. The PLD of claim 10, wherein the IP block comprises a programmable input-output cell (PIC), an embedded distributed memory (EBR), or a digital signal processing (DSP) block.

13. The PLD of claim 10, further comprising a configurable interconnect block (CIB) block to interface between the plurality of PLCs and a plurality of IP blocks.

14. The PLD of claim 10, further comprising:
a clock tree configured to generate a plurality of clock signals, including the first clock signal and the second clock signal; and
wherein the clock tree comprises the adjustable delay element.

15. The PLD of claim 10, wherein the adjustable delay element is further configured to apply the delay period to the second clock signal to synchronize the first clock signal and the first data signal at the first component of the IP block by adding a delay element to a signal path of the second clock signal to delay output of the first data signal by the delay period.

16. The PLD of claim 10, wherein:
the IP block comprises a first data path configured to route the first data signal to the first component; and
the first data path does not include a delay element.

17. A programmable logic device (PLD) comprising:
an intellectual property (IP) block configured to receive a first clock signal and a first data signal at a first component;
a plurality of programmable logic cells (PLCs) configured to receive a second clock signal, wherein a particular one of the PLCs is configured to output the first data signal to the IP block;
an adjustable delay element configured to apply a delay period to the second clock signal to synchronize the first clock signal and the first data signal at the first component of the IP block; and
a configurable interconnect block (CIB) block configured to route the first data signal from the particular one of the PLCs to the IP block and to route a second data signal from the IP block to the particular one of the PLCs.

18. The PLD of claim 17, wherein the CIB comprises scan test logic configured to, when activated in a test mode, bypass the delay period of the second clock signal.

19. The PLD of claim 17, wherein the adjustable delay element is configured to apply the delay period to the second clock signal by adjusting the second clock signal to delay output of the first data signal by the delay period.

20. The PLD of claim 17, wherein the adjustable delay element is configured to apply the delay period to the second clock signal by adding a delay element to a signal path of the second clock signal to delay output of the first data signal by the delay period.

* * * * *